United States Patent [19]

Jackson

[11] Patent Number: 4,797,844
[45] Date of Patent: Jan. 10, 1989

[54] DIGITAL MIXING APPARATUS WHICH ATTENUATES THE SUM FREQUENCY OF THE MIXED SIGNALS

[75] Inventor: Michael C. Jackson, Chelmsford, United Kingdom

[73] Assignee: The General Electric Company, p.l.c., London, England

[21] Appl. No.: 870,890

[22] Filed: Jun. 5, 1986

[30] Foreign Application Priority Data

Jun. 6, 1985 [GB] United Kingdom ............... 8514260

[51] Int. Cl.⁴ .............................................. G06F 15/31
[52] U.S. Cl. ............................................. 364/724.01
[58] Field of Search ...................... 364/724; 375/103

[56] References Cited

U.S. PATENT DOCUMENTS

| 3,935,535 | 1/1976 | Motley et al. | 364/724 X |
| 4,117,538 | 9/1978 | Shrader et al. | 364/724 X |
| 4,519,084 | 5/1985 | Langseth | 364/724 X |
| 4,633,426 | 12/1986 | Venier | 364/724 |

Primary Examiner—David H. Malzahn
Attorney, Agent, or Firm—Spencer & Frank

[57] ABSTRACT

In a radar receiver signals at IF are converted to digital form at 22 and the real and imaginary components are separated at 24 and 25 before passing to respective digital low-pass filters 28 and 29. These filters operate by adding samples within blocks of a given number of samples. In order to reduce the response of these filters at the sum frequency the first and last member of each blocks of samples taken by the filter is weighted so as to reduce its value relative to the centre values of the batch which are left unchanged relative to each other.

10 Claims, 3 Drawing Sheets

DIGITAL MIXING APPARATUS WHICH ATTENUATES THE SUM FREQUENCY OF THE MIXED SIGNALS

BACKGROUND OF THE INVENTION

This invention relates to a digital mixing apparatus. It arose in the design of an intermediate frequency digitizer for a radar receiver but would be equally applicable in other fields such as telecommunications.

A conventional arrangement for converting received radar signals into digital form is shown in FIG. 1. A signal received by an antenna 1, typically having a frequency of several GHz, is mixed at 2 with a local oscillator signal from 3. The output of the mixer 2 is passed through a bandpass filter 4. The output of the filter is at an intermediate frequency of, say, 60 MHz. This signal is passed to in phase (P) and quadrature (Q) channels generally indicated at 5 and 6 where it is mixed at 7 and 8 with a waveform from a second local oscillator 9 which also operates at 60 MHz and has its output phase shifted by 90 degrees at 10 before passing to the mixer 8. The outputs of the mixers 7 and 8 are passed through low-pass filters 11 and 12 and are amplified at 13 and 14. They are then converted into digital form by analogue-to-digital converters 15 and 16 clocked by a clock 17. The two outputs are the real and imaginary components of complex numbers representing samples of the signal at the frequency of the clock 17.

In a conventional system such as shown in FIG. 1 it is important that the mixers 7 and 8, filters 11 and 12, amplifiers 13 and 14 and analogue to digital converters 15 and 16 have exactly the same characteristics in each channel 5 and 6 and that the phase shift introduced at 10 be exactly 90 degrees. Otherwise the signal will be distorted. It can be troublesome and expensive to ensure that these requirements are met and remain so despite possible effects of ageing of the components.

SUMMARY OF THE INVENTION

Prior to the conception of the present invention it was believed by us that the aforementioned problems could be overcome by using an arrangement like that shown in FIG. 2 which performs the digitizing process at intermediate frequency instead of baseband. Referring to FIG. 2 RF signals from an antenna 18 are mixed at 19 with local oscillator signals from 20. The output of the mixer 19 is filtered at 21 and is converted into digital form at 22 to produce digital samples at a frequency determined by a clock 23. The digital output of 22 is passed to two channels where it is multiplied at 24 and 25 with phase and quadrature signals A and B as shown in FIG. 3. These phase and quadrature signals A and B are generated by weight generators 26 and 27 clocked by the same clock 23 as operates the analogue-to-digital converter 22. The resulting phase and quadrature digital signals are filtered by digital low-pass filters 28 and 29. Each of these digital filters operates by taking digital samples at its input in blocks and adding together the samples of each block.

It was initially envisaged that an arrangement like that of FIG. 2 would overcome the problems previously mentioned with respect to FIG. 1 because it would overcome the problem of matching the P and Q channels and of phase orthogonality because it is easy to make digital systems with exactly the same characteristics. A notable feature of the arrangement of FIG. 2 is that only one analogue to digital converter is used. This has to operate at a higher frequency than in the baseband digitization method of FIG. 1. However a higher quantization noise can be tolerated because such noise is reduced relative to the signal in the addition process carried out in the digital low-pass filters.

Initial trials of a system like that shown in FIG. 2 by us revealed to our dismay that the frequency responses of the two channels were not, as expected, the same. Various complicated weighting schemes in the addition process of the low pass filters were tried to correct this but these were expensive and did not adequately correct the differences in frequency response.

The invention arose from a realization that the frequency response of the digital filters is as shown in FIG. 4 where the difference and sum frequencies from the mixers 24 and 25 are shown at F1 and F2 respectively. It is to be noted that there is some response in the band shown at b where the sum frequency appears. This frequency response depends on the number of samples within each block taken by the digital low pass filter. The inventor realised that it would be possible to select a block having a slightly different number of samples (e.g., two fewer) to give a different frequency response, as shown by the broken lines on FIG. 3 which, when added to the response shown by the continuous lines, gives a combined response which is high at the difference frequency F1 but is substantially zero throughout the band B containing the sum frequency F2. The same effect can be achieved by simply doubling all the samples except one at each end of halving those at each end whilst leaving the majority in the middle unchanged relative to each other i.e., with unity weight. This effect can be achieved remarkably simply since there is no need to apply any weights to the majority of the samples.

Accordingly this invention provides digital mixing apparatus comprising means for providing digital signals representing sum and difference frequencies resulting from mixing a variable input signal with a predetermined signal, and a digital filter for removing the sum frequency, the digital filter comprising means for taking numbers representing successive samples of the mixer output in blocks and weighting at least the first and last number of each block to reduce their values relative to the others and/or vice versa, whilst leaving the majority of numbers within each block, between the first and last unchanged relative to each other.

DESCRIPTION OF PREFERRED EMBODIMENTS

Figure 1:
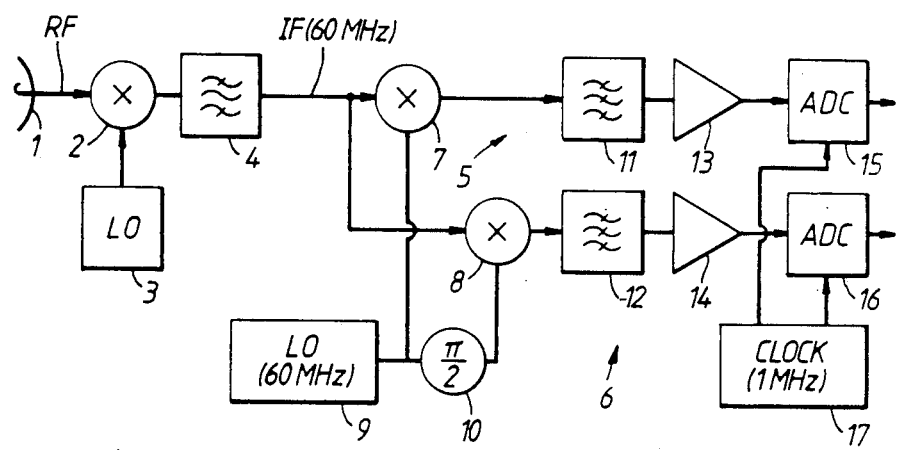
FIG. 1 is a schematic block diagram illustrating a conventional arrangement for converting received radar signals into digital form.
Figure 2:
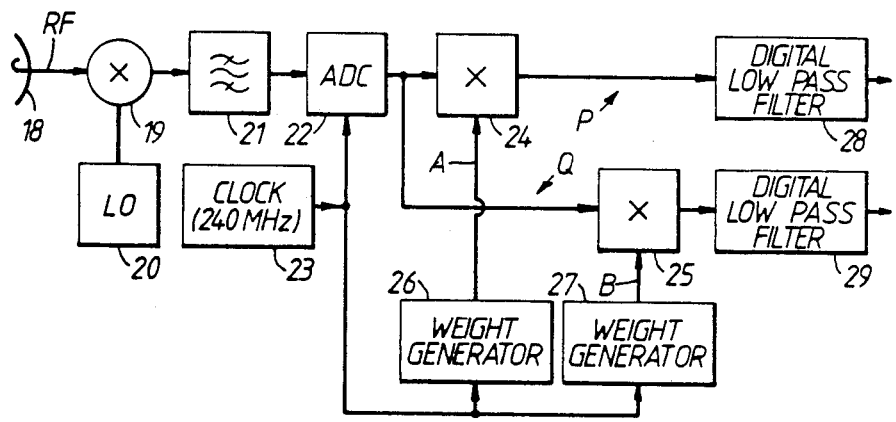
FIG. 2 is a schematic block diagram illustrating an alternative arrangement for converting received radar signals into digital form, with the digitalizing process being conducted at intermediate frequency.
Figure 3:
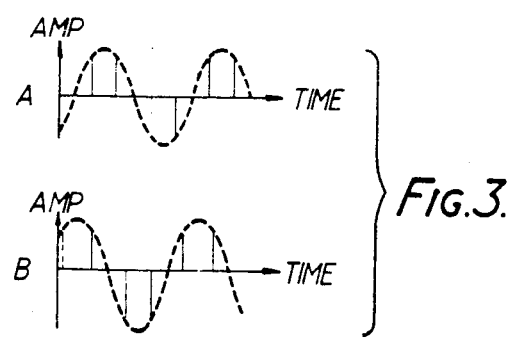
FIG. 3 is a graph of weights which digitally represent sine waves and which may provide in phase and quadrative signals for the multipliers of FIG. 2.

The following description will assume a familiarity with FIG. 2, which is described above.

In the arrangement of FIG. 2 the failure of the characteristics of the filters 28 and 29 to match each other is believed to be due to the fact that any residual sum component of the mixing process passing through this filter has opposite phases in the two channels thus causing unbalance between the two outputs. The effect of the invention in eliminating the sum component is therefore of particular significance in a system like that of FIG. 2 where means for providing digital signals is adapted to provide such signals on two channels representing respective real and imaginary components of complex numbers, and in which a digital filter as defined in the immediately preceding paragraph is provided for each such channel.

Figure 4:
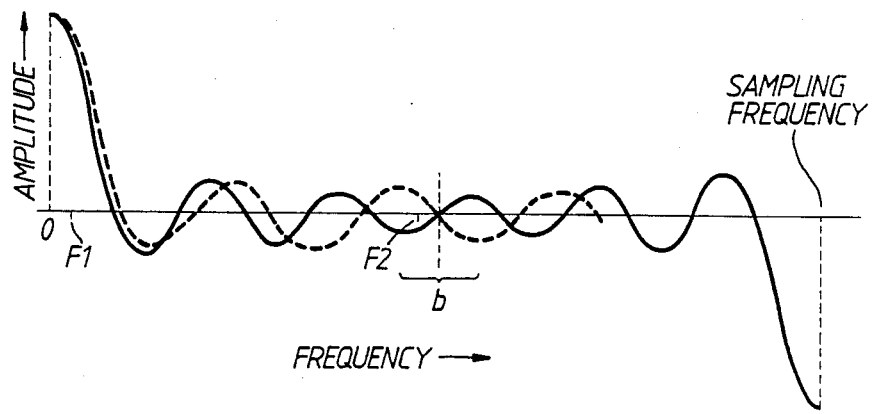
FIG. 4 is a graph illustrating the frequency response of the digital filters of FIG. 2.

The cancellation of the responses of FIG. 4 shown in continuous and broken lines is not perfect. A further improvement can be achieved by repeating the cancellation process to give weights of ¼ on the extreme end samples and ¾ on the next inward samples. An even further improvement can be achieved by using weights of one eighth, one half and seven eighths in that order starting from each end of the block of samples. It would of course be possible in theory to obtain further improvement by weighting more than three samples at each end. However, in practice, the small advantage to be gained in doing so would be outweighed by increased complexity.

The particular endweight patterns can be derived and generalised using the convolution theorem as it applies to filters in cascade. The aim is to have a small response around the nominal sum frequency ($F_+ = 2F_{IF}$) and this can always be achieved (irrespective of any other filtering) by passing the signals through a filter which has a null at $F_+$. Such a filter can be made by adding the signal to a replica of itself which has been delayed by a time equalling half a cycle at $F_+$ i.e., a quarter cycle at $F_{IF}$. The impulse response of this filter, i.e., the output waveform for a unit impulse input, is a pair of unit impulses separated by the delay time, $1/4F_{IF}$. When this is convolved with a train of N equal impulses the result is a train of N+1 impulses, of which the outer pair, numbers 1 and N+1, have the original height, and all the remaining N−1 have doubled height. In our context we make the end weights ½ to leave the inner weights 1. The fact that our filter is derived from a slightly shorter unweighted filter is irrelevant, and the actual length is arbitrary. More powerful filtering at frequencies around $F_+$ can be achieved if a number of the simple 2-weight filters just described are all cascaded with the original unweighted filter. In this case the taper of the end weights is such that the successive changes in the weights are given by the coefficients of $X^I$ in the binomial expansion of $(½+½x)^M$, where I=0, 1, ... M and M is the order of the composite filter. Thus M=1 gives a weight of ½, and M=2 gives weights of ¼ and ¼+2.¼=¾, as described. The overall filter length must obviously exceed 2M for there to be any unaffected weights left in the middle of the filter, but this is no problem in practice.

The same ideas can still be applied when there are more than 4 samples per cycle of the IF, provided that a multiple of 4 is used so that the ¼ cycle delay is an integral number of samples. Application of the convolution described above gives the same values for the weights, and reveals that each of these weights should be given to all samples in successive groups lasting ¼ cycle at IF.

For the purpose of explaining the principles used two distinct sets of weights have been mentioned, namely those generated at 26 and 27 which represent the LO and those applied at 28 and 29 which shape the response of the digital low-pass filter. In practice however the two functions can be combined by multiplying corresponding values so that only one weight generator is needed in each of the baseband channels (P and Q). The system block diagram would be the same as that in FIG. 2, with modified weight values and with the digital low-pass filter simply adding the weighted samples together in blocks and dumping the results at intervals corresponding to the integration time. The weight generator does not have to compute each weight anew because a repeating pattern is used and they can be stored in a computer-type memory which would be addressed sequentially by the sampling clock. A recirculating multibit shift register would be one possibility.

It is possible to take more than four samples per IF cycle, but normally only integral multiples of 4 will be used to make 90° shifts easy. In this more general case the samples would be treated in groups which are ¼ cycle long at IF. Thus at twelve samples per cycle we might take the last three at each end with weight ¼ and the next inner threes with weight ¾.

Figure 5:
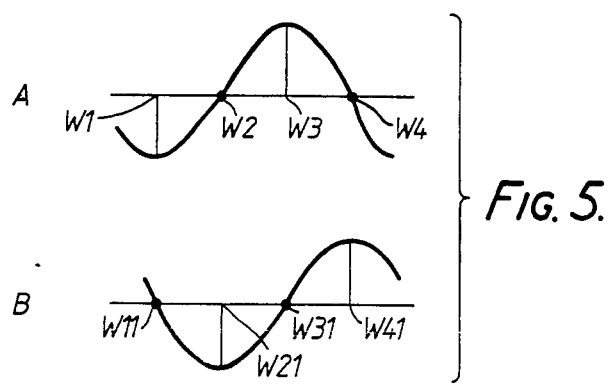
FIG. 5 is a graph corresponding to FIG. 3 but illustrating another possible pattern of weights for four samples per cycle.

The weights shown at 3A and 3B are digital representations of sine waves as shown in broken lines with four weights for each cycle. There is another possible pattern of weights for four samples per cycle as shown in FIG. 5 where 5A shows the alternative weights generated at 26 and 5B shows the alternative weights generated at 27. In the patterns of FIG. 5 alternate weights W2 W4 or W11 W31 are on the zero crossing points of the sine waves which they are to represent so that in effect only two weights W1 W3 or W21 W41 need to be generated for each cycle in each channel. This is considered beneficial since it simplifies the electronics.

Figure 6:
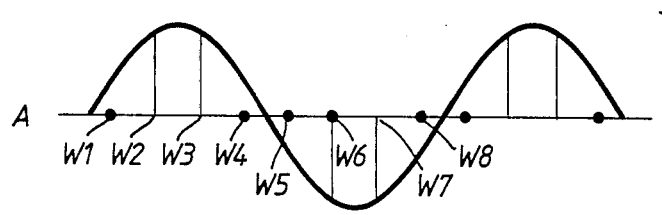
FIG. 6 is also a graph illustrating weights, with eight samples per cycle being used.
Figure 6:
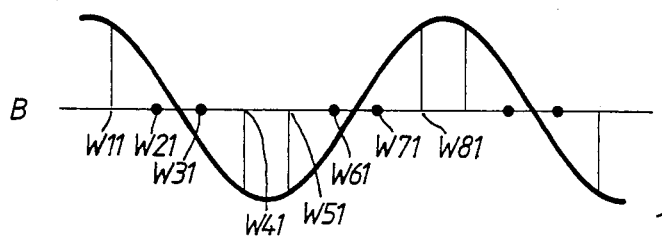
Figure 7:
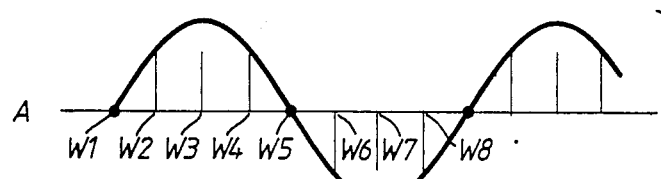
FIG. 7 is a further graph illustrating weights, with eight samples per cycle also being used.
Figure 7:
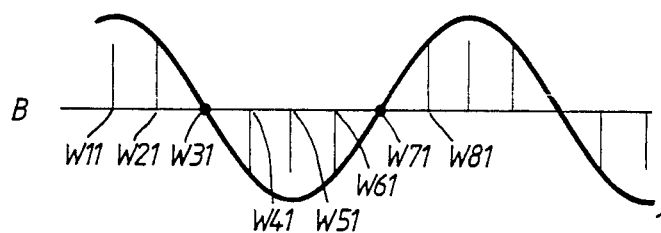

The idea of representing the sine wave using weights some of which lie on the zero crossing points of the sine wave, and therefore can be omitted, can be applied to systems which use more than four samples per cycle (preferably a multiple of four to obtain the required 90° phase shift). This idea can also be applied where none of the weights lie on the zero crossing points but some of them are close to the zero crossing points as shown for example in FIG. 6 where eight samples per cycle are used. In FIG. 6 half the weights, namely the weights W1, W4, W5, W8 etc which lie closest to the zero crossing points are omitted in one of the channels and weights W21, W31, W61, W71 etc are omitted in the other. FIG. 7 shows a possibility using eight samples per cycle which gives a better performance than FIG. 6 but which allows elimination of only a quarter of the weights, namely those which lie on the zero crossing points.

It is of course possible to use more than eight samples per cycle but four or eight are considered to be the most useful whilst twelve, sixteen or even twenty would possibly be practicable. More than twenty would be unattractive because of technical problems with the speed. It is considered best to eliminate from ¼ to ½ of the samples in each channel. To eliminate more than ½ would cause an unacceptable reduction in performance. To eliminate fewer than ¼ could still be beneficial but is not preferred because the same improvement in performance can be obtained more easily.

So far the possibility of representing the LO by weights of only 0 or ±1 have been considered, but it will be appreciated that the described concept of eliminating some of the weights would be applicable to systems which used various weight values. For example in FIGS. 7A and B the weight W3, W7, W11 and W51 etc could be of increased magnitude.

It should be noted that even if a sample is ignored in one or other of the channels 5 and 6 by virtue of being given a local oscillator weight of zero, it still counts as a member of the block of samples combined by the digital low-pass filters 28 and 29. Thus if end samples are inactivated, e.g., by the weight shown in FIG. 5, the reduced endweights in the filter still apply to them, not to the next active sample.

I claim:

1. Digital mixing apparatus comprising:
   means, responsive to a variable input signal and a predetermined input signal, for mixing the input signals and for providing a mixed output signal in digital form, each input signal representing a respective frequency and the mixed output signal representing sum and difference frequencies of the input signals, and a digital filter for removing the sum frequency, the digital filter including means for taking numbers representing successive samples of the mixed output signal in blocks and weighting selected numbers of each block so as to reduce the magnitude of at least the first and last number of each block relative to the others whilst having the majority of the numbers within each block, between the first and last, unchanged relative to each other.

2. Apparatus according to claim 1, wherein the mixed output signal corresponds to the real component of a complex number, and further comprising means for providing an additional output signal in digital form, the additional output signal representing sum and difference frequencies of the input signals and corresponding to the imaginary component of the complex number, and an additional digital filter for removing the sum frequency of the additional output signal, the additional digital filter including means for taking numbers representing samples of the additional output signal in blocks and weighing selected numbers of each block so as to reduce the magnitude of at least the first and last number of each block relative to the others whilst having the majority of the numbers within each block, between the first and last, unchanged relative to each other.

3. Apparatus according to claim 2 in which the weighting has the effect of halving the end two samples relative to the others.

4. Apparatus according to claim 2 in which the weighting has the effect of giving the end two samples weights of approximately ¼ and giving the adjacent samples weights of approximately ¾.

5. Apparatus according to claim 2 in which the weighting has the effect of giving the end two samples weights of approximately one eighth, the adjacent samples weights of approximately one half, and those samples which are third from the ends weights of approximately seven eighths.

6. Apparatus according to claim 1 in which the weighting has the effect of halving the end two samples relative to the others.

7. Apparatus according to claim 1 in which the weighting has the effect of giving the end two samples weights of approximately ¼ and giving the adjacent samples weights of approximately ¾.

8. Apparatus according to claim 1 in which the weighting has the effect of giving the end two samples weights of approximately one eighth, the adjacent samples weights of approximately one half, and those samples which are third from the end weights of approximately seven eighths.

9. Digital mixing apparatus comprising:
   means, responsive to a variable input signal and a predetermined input signal, for mixing the input signals and for providing a mixed output signal in digital form, each input signal representing a respective frequency and the mixed output signal representing sum and difference frequencies of the input signals, and a digital filter for removing the sum frequency, the digital filter including means for taking numbers representing successive samples of the mixed output signal in blocks, and weighting selected numbers of each block so as to reduce the magnitude of at least the first and last number of each block relative to the others in such a way that successive changes in the weights are given by the coefficients of $X^I$ in the binomial expansion of $(\frac{1}{2}+\frac{1}{2}X)^M$ where I is an integer from 0 to M and M is another integer.

10. Apparatus for producing from a digital input signal at a particular sampling frequency, two further signals representing the real and imaginary components of it, the digital input signal corresponding to a sequence of input signal numbers, the apparatus comprising: means for generating two sequences of weights each at the sampling frequency representing sine waves in phase quadrature and means for applying the weights of each sequence to successive input signal numbers to produce the real and imaginary components, wherein some of the weights lying on or closest to the zero crossing points of the sine waves are made zero, the other weights being of equal magnitude.

* * * * *